United States Patent
Hsu et al.

(10) Patent No.: US 7,174,631 B2
(45) Date of Patent: Feb. 13, 2007

(54) METHOD OF FABRICATING ELECTRICAL CONNECTION TERMINAL OF EMBEDDED CHIP

(75) Inventors: Shih-Ping Hsu, Hsin-chu (TW); Kun-Chen Tsai, Hsin-chu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 10/923,711

(22) Filed: Aug. 24, 2004

(65) Prior Publication Data
US 2005/0224976 A1    Oct. 13, 2005

(30) Foreign Application Priority Data
Apr. 12, 2004    (TW) ................ 93110073 A

(51) Int. Cl.
*H01K 3/22*    (2006.01)
(52) U.S. Cl. ............... 29/848; 29/830; 29/832; 29/846; 257/678; 438/100; 438/108; 438/127; 174/524
(58) Field of Classification Search .......... 29/830, 29/848, 831, 832, 841, 846, 852, 854, 855; 257/678; 438/100, 106, 108, 109, 113, 127; 174/524
See application file for complete search history.

(56) References Cited

U.S. PATENT DOCUMENTS

| | | | |
|---|---|---|---|
| 6,586,822 B1 * | 7/2003 | Vu et al. ............... | 257/678 |
| 6,701,614 B2 * | 3/2004 | Ding et al. ............ | 29/848 |
| 6,813,828 B2 * | 11/2004 | Dlugokecki et al. ..... | 29/827 |
| 6,931,725 B2 * | 8/2005 | Sugaya et al. ......... | 29/852 |

* cited by examiner

*Primary Examiner*—Richard Chang
(74) *Attorney, Agent, or Firm*—Clark & Brody; William F. Nixon

(57) ABSTRACT

An electrical connection terminal of an embedded chip and a method for fabricating the same are disclosed. An insulating layer is provided on a circuit board integrated with a chip and has a plurality of first openings for exposing a conductive pad of the chip. A first metal layer is formed on the conductive pad, and a conductive layer if formed on surfaces of the first metal layer, the insulating layer and the first openings. A patterned resist layer is formed on the conductive layer and has a plurality of second openings for exposing a part of the conductive layer corresponding to the condictive pad of the chip. A second metal layer is formed on the exposed part of the conductive layer by an electroplating process. Thus, the fabrication of conductive structure of the conductive pad of the ship and build-up of conductive circuits on the circuit board are integrated simultaneously.

5 Claims, 9 Drawing Sheets

METHOD OF FABRICATING ELECTRICAL CONNECTION TERMINAL OF EMBEDDED CHIP

FIELD OF THE INVENTION

The present invention relates to an electrical connection terminal of an embedded chip and a method for fabricating the same, and more particularly, to an electrical connection terminal of a semiconductor chip integrated in a circuit board and a method for fabricating the same.

BACKGROUND OF THE INVENTION

Along with the development of semiconductor packaging technologies, different types of semiconductor devices have been produced. Ball Grid Array (BGA) package adopts an advanced type of the semiconductor packaging technology which is characterized in the use of a substrate whose front side is mounted with a semiconductor chip and whose back side is mounted with a grid array of solder balls using self-alignment techniques. Thus, more input/output (I/O) connections can be accommodated on the same unit area of a semiconductor chip carrier to meet requirements for the semiconductor chip of high integration, so that an entire package unit is bonded and electrically connected to an external printed circuit board via the solder balls.

However, fabrication process of the semiconductor device generally involves fabricating chip carriers such as a substrate or a lead frame in chip carrier manufacturing followed by subsequent processes of chip-mounting, molding and solder ball implantation in semiconductor packaging to eventually achieve desired electronic performances of the semiconductor device. The actual fabrication processes of the semiconductor device are complicated and integration of interface can be difficult since the semiconductor device is fabricated by different industries (including the chip carrier manufacturing and the semiconductor packaging). Additionally, if the client terminal wishes to design with altered functions, the level of integration and alteration involved would be more complicated; thereby flexibility and economical efficiency for desired modification are not met.

Moreover, for the general fabrication process of a flip-chip based semiconductor device, an under bump metallurgy (UBM) layer is formed on a conductive pad of a chip within a wafer for accommodating a metal bump after fabrication of the wafer integrated circuit is completed. Subsequently, the wafer is singulated to produce a plurality of chips by a singulation process and the flip-chip based semiconductor chip is then mounted on and electrically connected to a substrate. In the process of fabricating the UBM structural layer and the metal bump, a passivation layer is firstly formed on a surface of the semiconductor wafer while exposing the conductive pad. An UBM layer comprising multiple layers of metal is formed on the exposed conductive pad by sputtering and electroplating processes. Then, a solder mask layer predefined with a plurality of openings is formed on the passivation layer to expose the UBM layer. Next, a coating process is performed to apply solder material such as Sn/Pb alloy on the exposed UBM layer through the openings of the solder mask layer by screen-printing techniques. The solder is bonded to the UBM layer by a reflow process, followed by removing the solder mask layer. Subsequently, a second reflow process is performed to round up the solder material so as to form the metal bump on the semiconductor wafer, such that the metal bump serves to connect the semiconductor chip and the substrate before semiconductor packaging is performed.

However, the above fabrication is complex and the integration of interface is difficult. Therefore, a circuit board structure for integrating fabrication of the chip carrier and the semiconductor package has been developed. After the wafer integrated circuit process is complete and a conductive structure is formed on the conductive pad of the chip within the wafer, a singulation process is performed to cut the wafer into a plurality of chip units, and the chip units are embedded in the predefined openings of the circuit board. Subsequently, an electroplated metal structure is formed on the conductive structure to electrically connect the chip and the circuit board, so as to provide the circuit board integrated with the semiconductor chip.

FIGS. 1A through to 1I illustrate processes of forming the conductive structure and the electroplated metal structure on the conductive pad of a wafer. Referring to FIG. 1A, a wafer 10 having a plurality of chips 100 is provided, wherein the wafer 10 is completed with integrated circuit fabrication and a patterned passivation layer 11 is formed on a surface of the wafer 10 to expose conductive pads 12 of the chips provided within the wafer. Referring to FIG. 1B, a zincified layer 13 (serving as a catalytic layer) and an electroless-plating nickel layer 14 are formed on the conductive pad 12, such that the nickel layer 14 is effectively adsorbed on the conductive pad 12 to provide an efficient isolation barrier between the conductive pad 12 and subsequently formed copper metal. Referring to FIG. 1C, an impregnant gold layer 15 is formed on the nickel layer 14 to passivate the nickel layer 14 while allowing the subsequently deposited copper metal to be effectively adsorbed thereon. Referring to FIG. 1D, a thick electroless-plating copper layer 16 is formed on the gold layer 15 and the wafer 10 is singulated to produce a plurality of chips 100. Then, the chips 100 are embedded in predefined openings 102 of a circuit board 101. Referring to FIG. 1E, an insulating layer 17 such as ABF (Ajinomoto build-up film (commercial name), produced by Ajinomoto Co., Inc. Japan) is formed on a surface of the circuit board 101 embedded with the chips 100. FIG. 1E illustrates only one conductive pad 12 of the circuit board 101 shown in FIG. 1D. Referring to FIG. 1F, a part of the insulating layer 17 and thick copper layer 16 corresponding to the conductive pad 12 of the chip is removed using laser-drilling techniques to form an opening 170, such that the thick copper layer 16 that remains in the opening 170 serves as an adhesion layer for subsequent metal deposition. The opening 170 is then subjected to a de-smear process. Referring to FIG. 1G, a conductive layer 18 is formed over the insulating layer 17 and the opening 170. The conductive layer 18 is made by electroplating with a palladium layer (serving as a catalytic layer) followed by an electroless plating process to form the copper layer. Referring to FIG. 1H, a patterned resist layer 19 having a plurality of openings 190 is formed on the conductive layer 18 to expose a part of the conductive layer 18 corresponding to the conductive pad of the chip. Referring to FIG. 1I, an electroplated metal structure 191 such as copper metal is formed within the opening 190 of the resist layer 19 by an electroplating process to subsequently provide a conduction path between the chip and the circuit board.

However, during the formation of the conductive structure on the conductive pad of the chip, it is necessary to form the nickel layer and the thick copper layer in sequence by the electroless plating process, which requires a long fabrication time and a large fabrication cost. This leads to remarkable drop in fabrication efficiency. Moreover, a gold layer is usually deposited prior to the formation of the thick copper layer, which deposition further complicates the fabrication process and increases the fabrication cost.

SUMMARY OF THE INVENTION

In light of the above prior-art drawbacks, an objective of the present invention is to provide an electrical connection terminal of an embedded chip and a method for fabricating the same, so as to effectively shorten processes and time of fabrication.

Another objective of the present invention is to provide an electrical connection terminal of an embedded chip and a method for fabricating the same, so as to effectively minimize fabrication costs.

In accordance with the above and other objectives, the present invention proposes a method for fabricating an electrical connection terminal of an embedded chip, which involves embedding the chip units in a circuit board, forming an insulating layer on the circuit board embedded with the chip, and the insulating layer is defined with a plurality of first openings after a wafer integrated circuit process is completed and subjected to a singulation process for providing a plurality of chip units. At least one of the first openings corresponds to a conductive pad of the chip to thereby expose the conductive pad, and a first metal layer is further formed on the conductive pad of the chip. A conductive layer is formed on a surface of the first metal layer, the insulating layer and the first openings. Subsequently, a patterned resist layer having a plurality of second openings is formed on the conductive layer to expose a part of the conductive layer to be subsequently deposited with a second metal layer, and at least one of the second openings of the resist layer corresponds to the conductive pad of the chip, such that the second metal layer such as a copper layer can be subsequently formed on the exposed part of the conductive layer by an electroplating process.

The present invention also proposes an electrical connection terminal of an embedded chip fabricated according to the foregoing fabrication method, which structure comprises a conductive pad, a first metal layer deposited on the conductive pad, a conductive layer deposited on the first metal layer, and a second metal layer deposited on the conductive layer by an electroplating process.

Therefore, the electrical connection terminal of an embedded chip and the method for fabricating the same proposed in the present invention is characterized by cutting the wafer into a plurality of chip units, and embedding the chip units in the circuit board after the wafer integrated circuit process is completed. Subsequently, the first metal layer (such as a nickel layer) is directly deposited on the conductive pad of the chip embedded in the circuit board. Then, the second metal layer and a build-up circuit structure are respectively deposited on the first metal layer and the circuit board by the electroplating process. That is, the conductive structure is formed on the conductive pad of the chip by electroplating process, and the build-up layer of the conductive circuit is formed on the circuit board according to the present invention. In contrast, in the conventional method for fabricating the conductive terminal of the embedded chip, it is necessary to form a conductive structure on a conductive pad before the wafer is singulated to produce a plurality of chip units which is subsequently embedded in a circuit board after a wafer integrated circuit process is completed. Then the process for integrating the chip and the circuit board and other complicated processes are performed. And formation of an electroless plated copper as the conductive structure also cost more fabrication time and budget. Thus, the present invention simplifies the fabrication process and minimizes the cost by comparison to the prior-art.

BRIEF DESCRIPTION OF THE DRAWINGS

The present invention can be more fully understood from the following detailed description of the preferred embodiments, with reference made to the accompanying drawings, wherein.

DETAILED DESCRIPTION OF THE EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

Figure 1A:
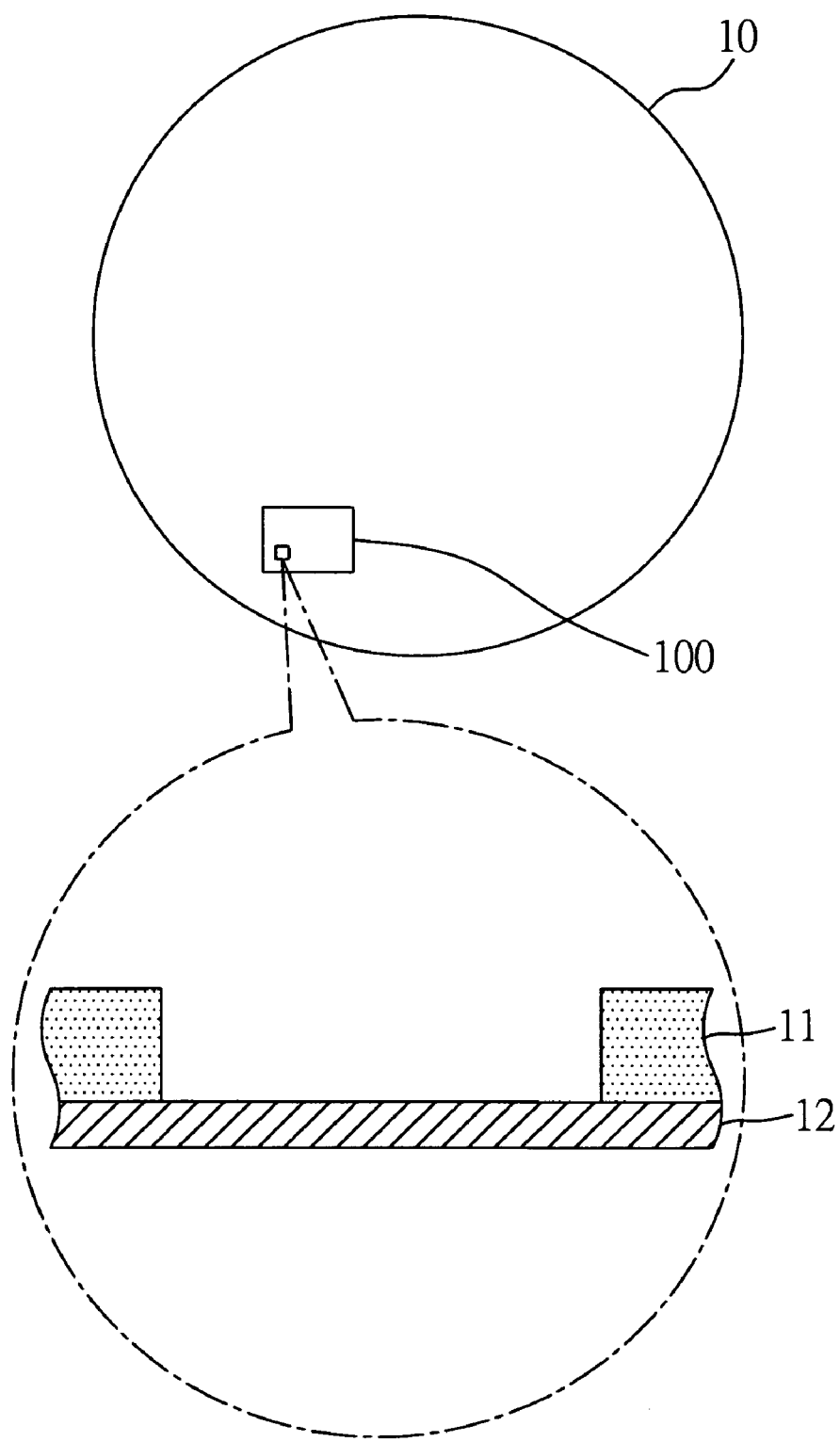
FIGS. 1A through to 1I are cross-sectional views illustrating a method for fabricating an electrical connection terminal of an embedded chip according to the prior-art.
Figure 1B:
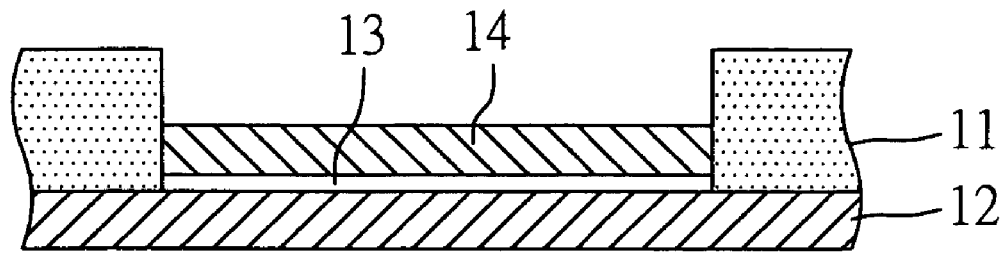
Figure 1C:
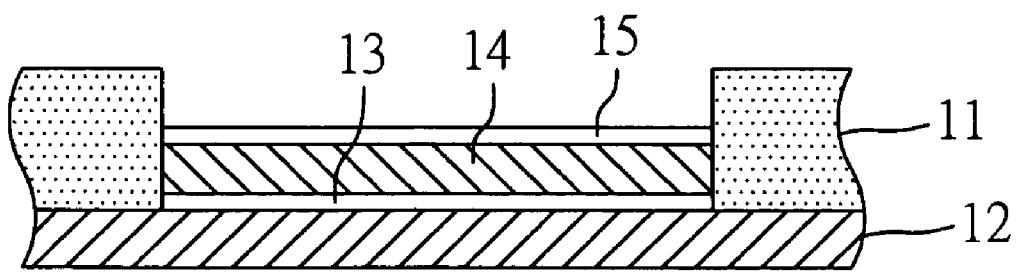
Figure 1D:
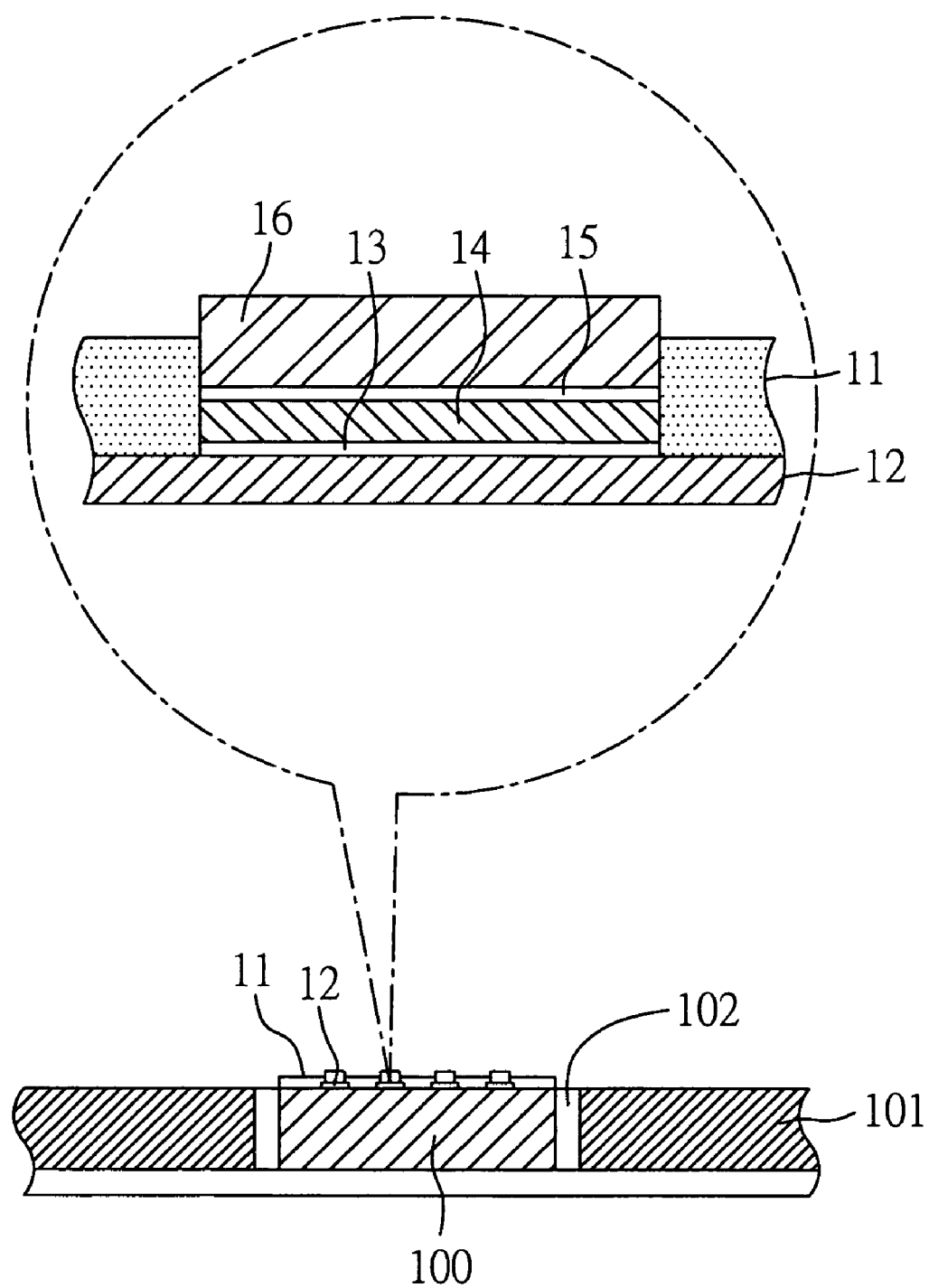
Figure 1E:
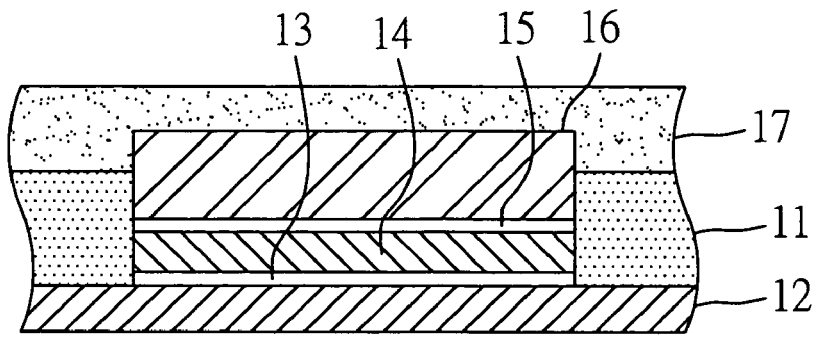
Figure 1F:
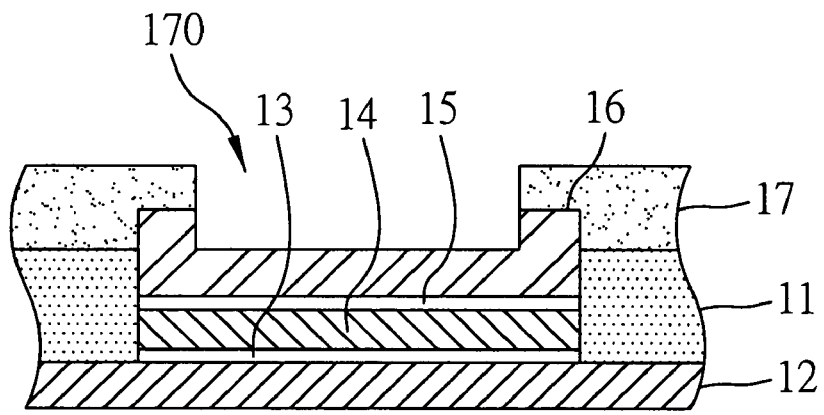
Figure 1G:
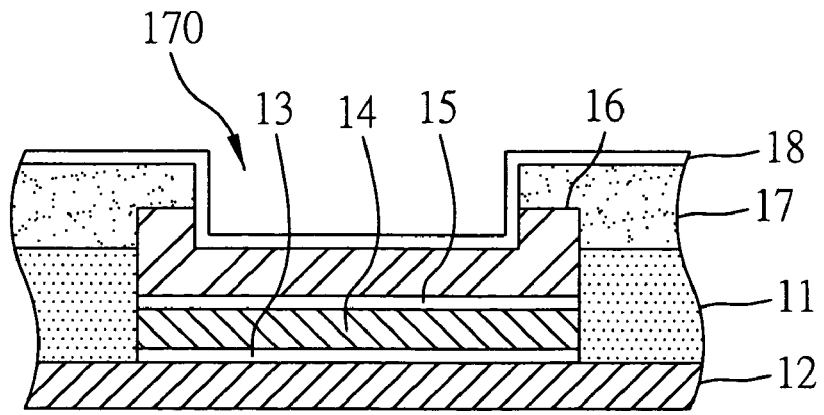
Figure 1H:
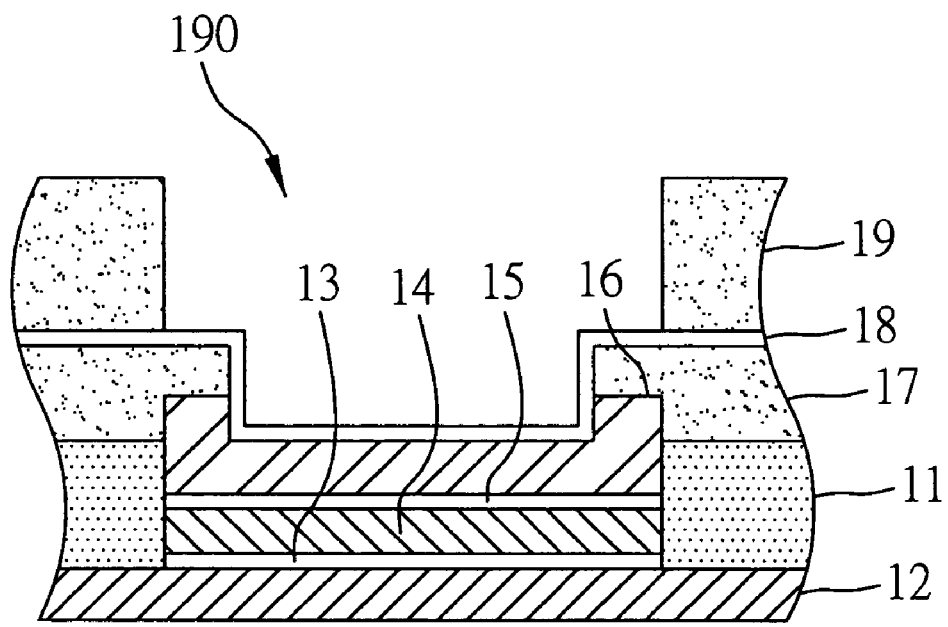
Figure 1I:
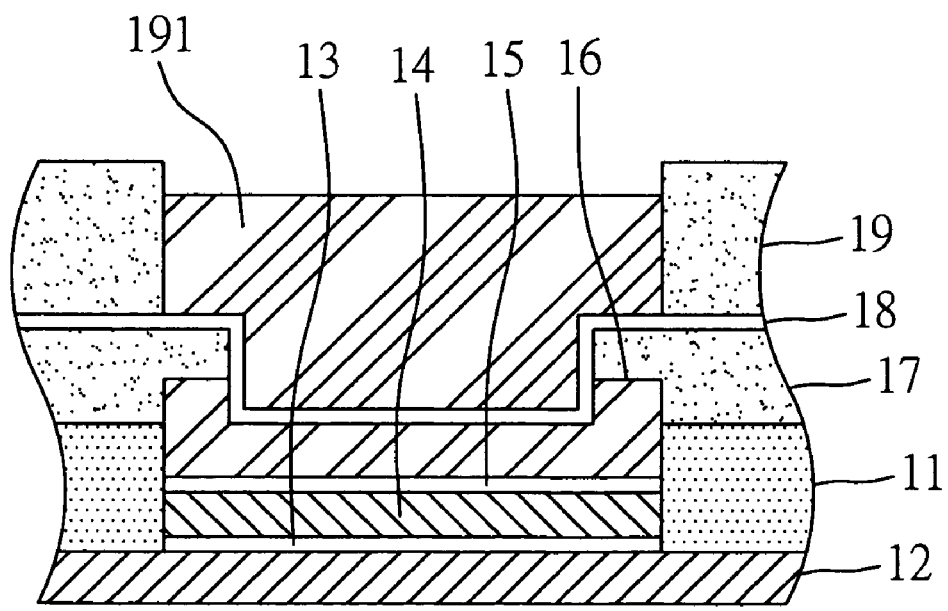
Figure 2A:
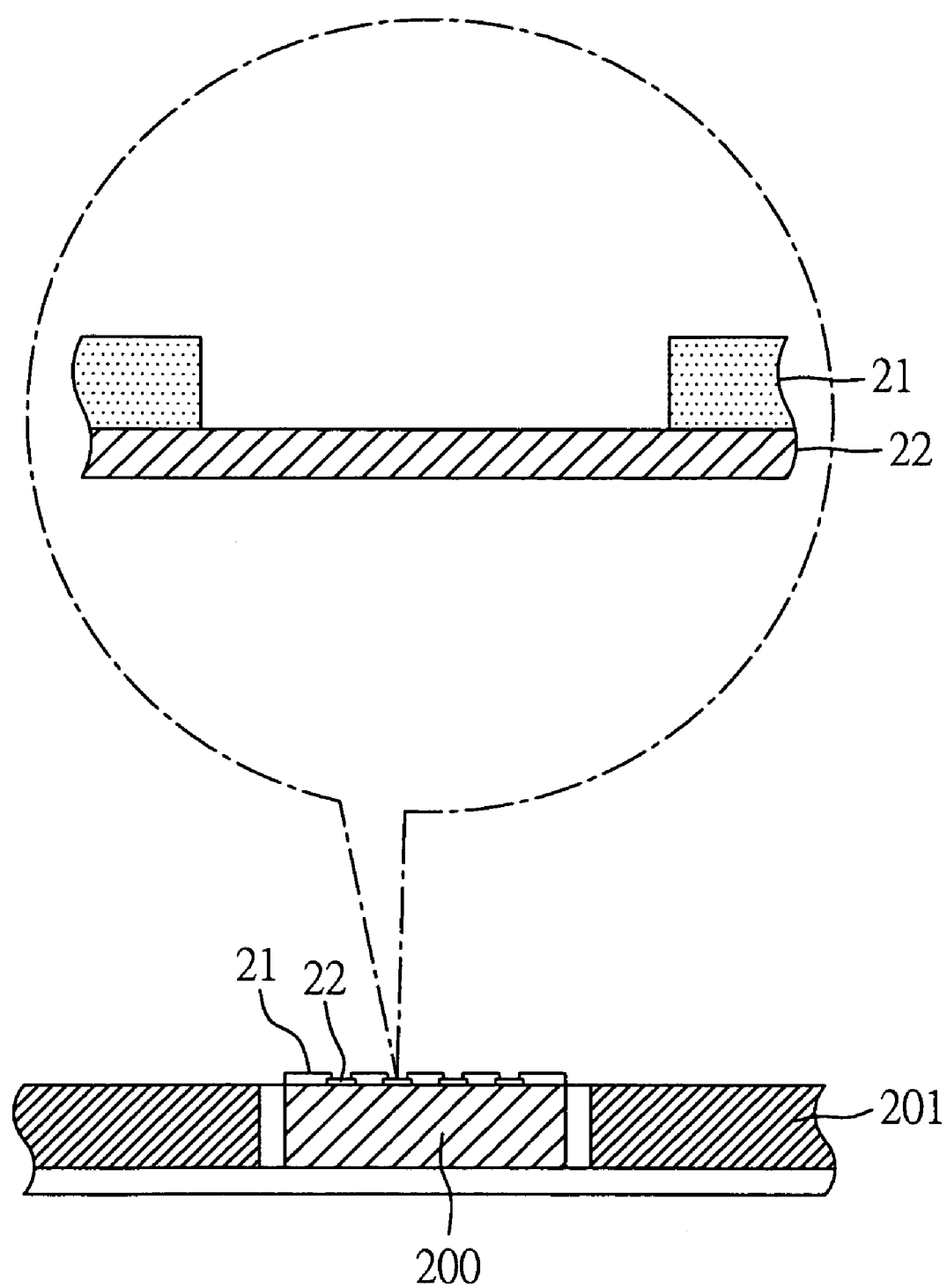
FIGS. 2A through to 2H are cross-sectional views illustrating a method for fabricating an electrical connection terminal of an embedded chip according to the present invention.

FIGS. 2A through to 2H are cross-sectional views of a method of fabricating an electrical connection terminal of an embedded chip according to the present invention.

Referring to FIG. 2A, after a wafer integrated circuit process is completed and the wafer is singulated to provide a plurality of chips 200, each of the chips 200 is embedded in a circuit board 201. A passivation layer 21 such as a dielectric layer is formed on a surface of the chip 200. For example, a polyimide layer, silicon dioxide layer or silicon nitride layer may be used during general fabrication process to cover the surface of the chip 200 for protecting the chip 200 from external contamination and damage. Also, the passivation layer 21 has a plurality of openings to expose conductive pads 22 of the chip 200. In order to simplify drawings and description, only a single conductive pad is demonstrated in the present embodiment for description since the conductive pads 22 of the chip 200 are approximately the same.

Figure 2B:
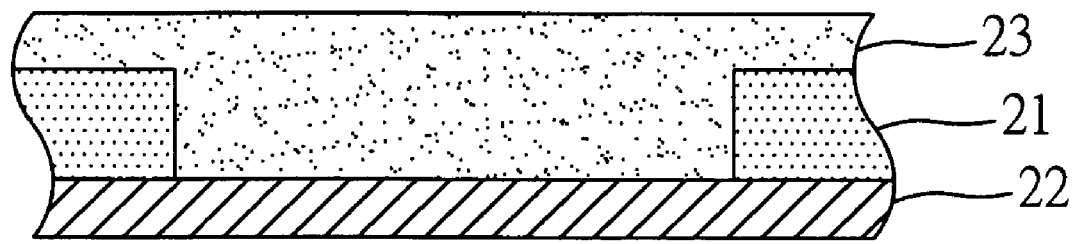

Referring to FIG. 2B, an insulating layer 23 is formed on the circuit board 201 embedded with the chip 200. The insulating layer 23 can be selected from a group consisting of non-fibrous resin-typed materials such as ABF (Ajinomoto build-up film) or fibrous impregnant resin materials such as bismaleimide triazine (BT), benzocyclobuthene (BCB), liquid crystal polymer (LCP), polyimide (PI), poly tetrafluoro ethylene (PTFE), epoxy resin and glass fiber (FR4 and FR5).

Figure 2C:
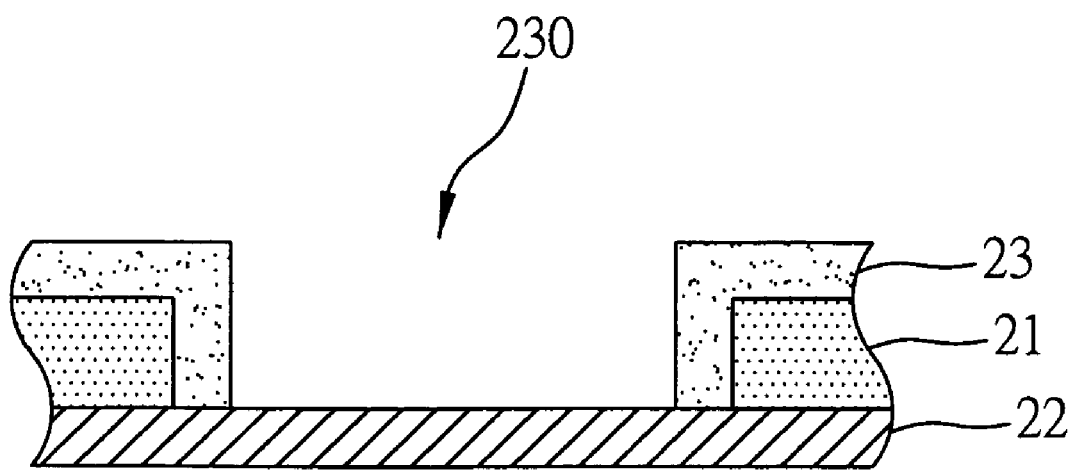

Referring to FIG. 2C, a part of the insulating layer 23 is removed using techniques such as laser drilling to form a plurality of openings 230 in the insulating layer 230. At least one of the openings 230 corresponds to a position of the conductive pad 22 to expose the conductive pad 22 of the chip 200. However, a de-smear process is performed to remove any smears left within the opening 230 after laser drilling. If the insulating layer 23 is made of photo-sensitive insulating materials, a plurality of openings 230 can be formed by exposing or developing techniques. Subsequently, a de-scum process is performed to remove the any scums left within the opening 230 caused by the developing process.

Figure 2D:
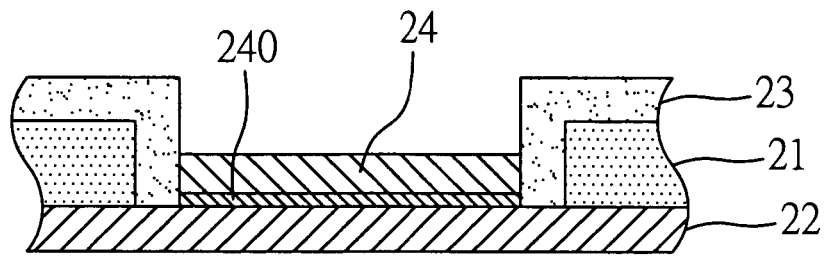

Referring to FIG. 2D, at least a metal layer 24 is formed on the conductive pad 22 of the chip 200 to serve as a barrier layer. The metal layer 24 is preferably a nickel metal layer deposited by an electroless plating process. Also, in order to provide the nickel layer 24 that is effectively adsorbed on the conductive pad 22, a metallized treatment layer 240 (such as a zincified treatment layer) can be pre-deposited on the conductive pad 22.

Figure 2E:
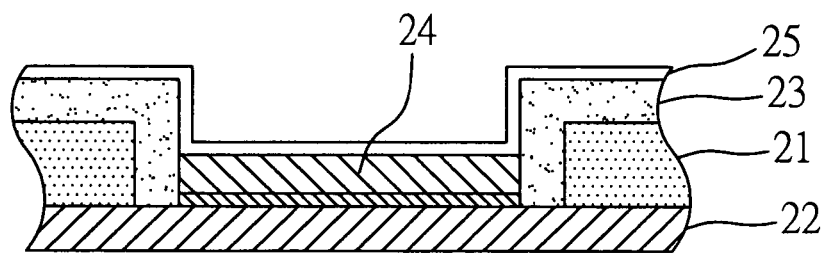

Referring to FIG. 2E, a conductive layer 25 is formed on a surface of the metal layer 24, the insulating layer 23 and the opening 230. The conductive layer 25 which mainly serves as current conduction paths during subsequent electroplating processes can be made of a conductive polymer, a metal, an alloy, or several deposited metal layers, selected from a group consisting of copper (Cu), tin (Sn), nickel (Ni), chromium (Cr), titanium (Ti), Cu/Cr alloy or Sn/Pb alloy. The conductive layer 25 may be formed by the physical vapor deposition (PVD), chemical vapor deposition (CVD), electroless plating or chemical deposition techniques, such as sputtering, evaporation, arc vapor deposition, ion beam sputtering, laser ablation deposition, or plasma enhanced chemical vapor deposition (PECVD). Preferably, the conductive layer 25 is made by electroless-plating with copper particles.

Figure 2F:
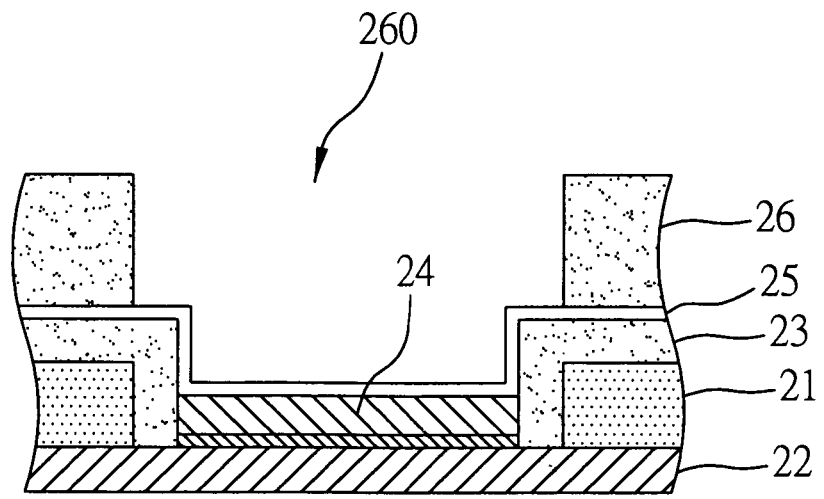

Referring to FIG. 2F, a patterned resist layer 26 that serves as an electroplated resist layer is formed on the conductive layer 25. A plurality of openings 260 is formed through the resist layer 26 to expose a part of the conductive layer 25 to be subsequently deposited with a metal layer, and at least one of the openings 260 corresponds to a position of the conductive pad 22 of the chip 200.

Figure 2G:
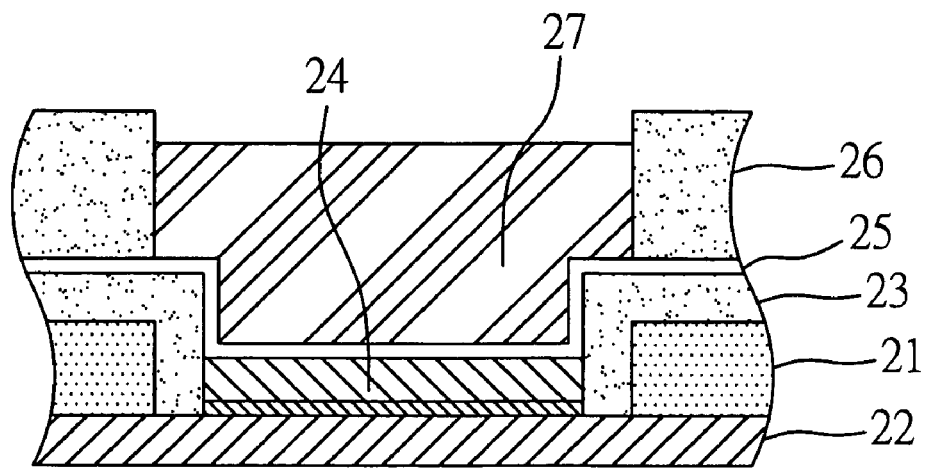

Referring to FIG. 2G, an electroplated metal layer 27 such as a copper layer may be formed on exposed the conductive layer 25 by an electroplating process. Circuit layers (not shown) can be simultaneously formed on the circuit board 201 embedded with the chip 200 while the electroplated metal layer 27 is formed on the conductive pad 22 of the chip 200 by the electroplating process. Therefore, fabrication of conductive structures on the conductive pad of the chip and build-up of conductive circuits on the circuit board can be simultaneously performed to simplify the fabrication process and to minimize the cost.

Figure 2H:
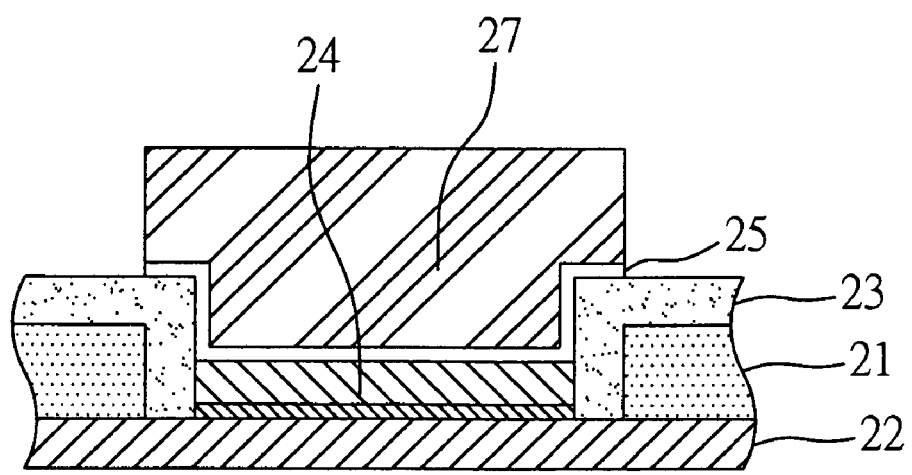

Referring to FIG. 2H, the resist layer 26 and a part of the conductive layer 25 covered by the resist layer 26 can be removed after the formation of the electroplated metal layer 27.

Referring to FIG. 2G, the present invention also proposes an electrical connection terminal of an embedded chip using the foregoing fabrication method. The electrical connection terminal comprises a conductive pad 22, a metal layer 24 deposited on the conductive pad 22, a conductive layer 25 deposited on the metal layer 24 and an electroplated metal layer 27 deposited on the conductive layer 25 by an electroplating process.

Therefore, the electrical connection terminal of an embedded chip and the method for fabricating the same proposed in the present invention is characterized by cutting the wafer into a plurality of chip units, and embedding the chip units in the circuit board after the wafer integrated circuit process is completed. Subsequently, the nickel layer is directly deposited on the conductive pad of the chip embedded in the circuit board. Then, the copper layer and a build-up circuit structure are respectively deposited on the metal layer and the circuit board by the electroplating process. That is, the conductive structure is formed on the conductive pad of the chip by electroplating process, and the build-up layer of the conductive circuit is formed on the circuit board according to the present invention. In contrast, in the conventional method for fabricating the conductive terminal of the embedded chip, it is necessary to form a conductive structure on a conductive pad before the wafer is singulated to produce a plurality of chip units which is subsequently embedded in a circuit board after a wafer integrated circuit process is completed. Then the process for integrating the chip and the circuit board and other complicated processes are performed. And formation of an electroless plated copper as the conductive structure also cost more fabrication time and budget. Thus, the present invention simplifies the fabrication process and minimizes the cost by comparison to the prior-art.

TABLE OF REFERENCE NUMERALS

Circuit board 201
Chip 200
Conductive pads 22
Insulating layer 23
First openings 230
Zincified treatment layer 240
First metal layer 24
Conductive layer 25
Resist layer 26
Second openings 260
Second metal layer 27

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrical connection terminal of an embedded chip, which comprises the steps of:
   providing a circuit board embedded with a chip having a plurality of conductive pads on a surface thereof;
   forming an insulating layer on the circuit board, wherein the insulating layer is formed with a plurality of first openings, and at least one of the first openings corresponds to a position of the conductive pads of the chip;
   forming a zincified treatment layer on the conductive pad of the chip by pre-depositing the zincified treatment layer;
   forming a nickel layer on the zincified treatment layer by an electroplating process, for effectively adhering the nickel layer on the conductive pad with the zincified treatment layer;
   forming a conductive layer on a surface of the nickel layer, the insulating layer and the first opening thereof;
   forming a patterned resist layer on the conductive layer, wherein the resist layer having a plurality of second openings to expose a part of the conductive layer to be subsequently deposited with a metal layer, and at least one of the second openings corresponds to the position of the conductive pad of the chip; and forming a second metal layer on the exposed part of the conductive layer by an electroplating process.

2. The method for fabricating the electrical connection terminal of the embedded chip of claim 1, wherein the resist layer and a part of the conductive layer covered by the resist layer are removed after forming the electroplated metal layer.

3. The method for fabricating the electrical connection terminal of the embedded chip of claim 1, wherein the chip is embedded in the circuit board after a wafer is completed with wafer integrated circuit process and singulated to provide a plurality of chips.

4. The method for fabricating the electrical connection terminal of the embedded chip of claim 1, wherein the metal layer formed on the conductive pad of the chip is a copper layer.

5. The method for fabricating the electrical connection terminal of the embedded chip of claim 1, wherein the conductive layer is made of a material selected from a group consisting of copper (Cu), tin (Sn), nickel (Ni), chromium (Cr), titanium (Ti), Cu/Cr alloy, Sn/Pb alloy or a conductive polymer.

* * * * *